United States Patent [19]
Yoon et al.

[11] Patent Number: 5,796,293
[45] Date of Patent: Aug. 18, 1998

[54] VOLTAGE BOOSTING CIRCUITS HAVING BACKUP VOLTAGE BOOSTING CAPABILITY

[75] Inventors: Sei-Seung Yoon; Yong-Cheol Bae, both of Seoul, Rep. of Korea

[73] Assignee: Samsung Electronics Co., Ltd., Rep. of Korea

[21] Appl. No.: 748,189

[22] Filed: Nov. 12, 1996

[30] Foreign Application Priority Data

Nov. 13, 1995 [KR] Rep. of Korea ............... 95-40993

[51] Int. Cl.⁶ .................................................. G05F 1/10
[52] U.S. Cl. ........................... 327/536; 327/538; 327/540
[58] Field of Search ................................. 327/536, 538, 327/540, 541, 543, 589, 530, 535

[56] References Cited

U.S. PATENT DOCUMENTS

| | | | |
|---|---|---|---|
| 5,337,284 | 8/1994 | Cordoba et al. | 365/227 |
| 5,629,646 | 5/1997 | Menezes et al. | 327/536 |
| 5,642,073 | 6/1997 | Manning | 327/536 |

Primary Examiner—Timothy P. Callahan
Assistant Examiner—Jung Ho Kim
Attorney, Agent, or Firm—Myers Bigel Sibley & Sajovec, P.A.

[57] ABSTRACT

Voltage boosting circuits include backup voltage boosting circuits which are enabled during high current loading conditions when voltage sags in the potential of a boosted signal line(s) are encountered, and which provide independent level detection capability to bypass main voltage level detectors when relatively severe voltage sags are anticipated. In particular, voltage boosting circuits are provided which contain a main voltage boosting circuit and a backup voltage boosting circuit therein. The main voltage boosting circuit is typically powered at a first reference potential (e.g., Vcc) and preferably contains a main level detector, a built-in oscillator and a main pump coupled in series to drive a signal line (e.g., Vpp) to a boosted reference potential which is greater than the first reference potential, if a potential of the signal line drops below a second reference potential. To supplement the voltage boosting capability of the main pump, a backup voltage boosting circuit is provided containing an independent voltage level detector and at least one backup pump coupled in series therewith, to drive the signal line to the boosted reference potential, if the potential of the signal line drops below a third reference potential which may be greater than or equal to the second reference potential. Accordingly, the occurrence of relatively small voltage sags in the potential of the boosted signal line (e.g., Vpp) can trigger the backup pump during anticipated high current loading conditions, while the occurrence of larger voltage sags in the potential can trigger the main pump to assist the backup pump.

10 Claims, 7 Drawing Sheets

VOLTAGE BOOSTING CIRCUITS HAVING BACKUP VOLTAGE BOOSTING CAPABILITY

FIELD OF THE INVENTION

The present invention relates to integrated circuit devices, and more particularly to integrated circuit devices having voltage boosting circuits therein for generating voltages which exceed the power supply voltage.

BACKGROUND OF THE INVENTION

Voltage boosting circuits are especially useful in integrated circuits which require the generation and maintenance of "boosted" signal lines having voltages which exceed the power supply voltage (e.g., Vcc). For example, in the case of integrated circuit memory devices, word lines are typically boosted to relatively high voltages during programming and reading operations even if the power supply voltage is relatively small.

To supply boosted voltages internal to an integrated circuit memory device, voltage boosting pumps such as those illustrated by FIGS. 4–5 have been used to assist a main voltage boosting pump during high current loading conditions (e.g., active cycles). For example, the voltage boosting pumps 300 and 400 (i.e., kicker circuits) of FIG. 4 and 5, respectively, have been used together in conventional boosting circuits, such as the boosting circuit of FIG. 1, to drive a boosted signal line Vpp. Here, the boosting circuit of FIG. 1 includes a master clock generator 100, which is responsive to a row address strobe signal RASB, an active control unit 200, for generating a control signal PAKE which is a delayed version of the master clock signal PR as illustrated by FIG. 3, and first and second voltage boosting pumps 300 and 400 which trigger on rising and falling edges of the control signal PAKE, respectively. In particular, as illustrated by FIG. 2, transitions in the row address strobe signal RASB trigger opposite transitions in the master clock signal and the control signal PAKE.

Referring again to FIGS. 4–5, when the control signal PAKE is low (i.e., logic 0), the output of inverter 4 will be at a logic 1 potential to maintain node 5 in a precharged condition. As illustrated, node 5 is connected to a first pumping capacitor 7 and by an NMOS transistor 8 to the power supply potential Vcc. Here, the NMOS transistor 8 is connected as a diode to thereby provide current to node 5 when it is at a logic 0 potential. In addition, the output of inverter chain 3 will also be at logic 0 potential so that the second pumping capacitor is precharge to approximately the power supply potential because node 6 is maintained at a potential equal to about Vcc−Vthn by NMOS transistor 9, wherein Vthn is the threshold voltage of NMOS transistor 9. As illustrated, node 6 is connected to node 5 by NMOS transistor 10 which is also connected as a diode. Then, when the control signal PAKE switches from 0→1, the second pumping capacitor 12 (which is charged) will capacitively pump node 6 with a boosted potential to turn-on NMOS transistor 11 and pull-up or "boost" the signal line Vpp. As illustrated best by FIG. 5, these operations will also be performed at the falling edge of the control signal PAKE because the second pump 400 includes an input inverter 14.

Unfortunately, because the pumps 300 and 400 of FIGS. 4 and 5 operate irrespective of the actual potential of the boosted signal line Vpp and solely based on the length or duration of the row address strobe signal RASB, excessive (or insufficient) voltage boosting may occur. Thus, notwithstanding the above-described conventional boosting circuits for integrated circuit memory devices, there still continues to be a need for improved voltage boosting circuits which limit the likelihood of excessive or insufficient boosting.

SUMMARY OF THE INVENTION

It is therefore an object of the present invention to provide integrated circuit devices having improved voltage boosting circuits therein.

It is another object of the present invention to provide voltage boosting circuits which limit the likelihood of excessive or insufficient voltage boosting during high current loading conditions.

It is still another object of the present invention to provide voltage boosting circuits which provide controlled voltage boosting capability during high current loading conditions.

These and other objects, features and advantages of the present invention are provided by integrated circuit devices having backup voltage boosting capability during high current loading conditions when voltage sags in the potential of a boosted signal line(s) occur, and independent level detection capability to bypass a main voltage level detector and prevent excessive or insufficient voltage boosting. In particular, voltage boosting circuits are provided which contain a main voltage boosting circuit and a backup voltage boosting circuit therein. The main voltage boosting circuit is typically powered at a first reference potential (e.g., Vcc) and preferably contains a main voltage level detector, a built-in oscillator and a main voltage boosting pump coupled in series to drive a signal line (e.g., Vpp) to a boosted reference potential which is greater than the first reference potential, if a potential of the signal line drops below a second reference potential.

To supplement the voltage boosting capability of the main voltage boosting pump during high current loading conditions (e.g., when a DRAM memory device is in an active mode) and provide an independent voltage level detector to limit the likelihood of excessive or insufficient voltage boosting, a backup voltage boosting circuit is provided containing an independent voltage level detector and at least a first backup voltage boosting pump coupled in series therewith. These devices kick in to drive the signal line to the boosted reference potential when the potential of the signal line drops below a third reference potential (which may be greater than or equal to the second reference potential). Accordingly, the occurrence of relatively small voltage sags in the potential of the boosted signal line (e.g., Vpp) during high current loading conditions can trigger the backup voltage boosting pump while the occurrence of larger voltage sags can also trigger the main voltage boosting pump to assist the backup voltage boosting pump.

In addition, the independent voltage level detector has a first output dedicated to trigger the built-in oscillator (which drives the main voltage boosting pump), even if the main voltage level detector has not triggered the oscillator (e.g., because the potential of the signal line has not dropped below the second reference potential). The independent voltage level detector also has a second output for controlling operation of a first pulse generator which is coupled to an input of the first backup voltage boosting pump. A second backup voltage boosting pump may also be provided which is responsive to the second output. Here, a latch circuit, a delay circuit and a second pulse generator are provided in series to drive the second backup voltage boosting pump. The delay circuit is designed to provide sufficient delay so that the first and second backup voltage boosting pumps drive the signal line to the boosted reference potential during nonoverlapping time intervals which provide an effectively longer duration "boost" and therefore a more uniform supply of boosting current during high current loading conditions.

DESCRIPTION OF PREFERRED EMBODIMENTS

The present invention will now be described more fully hereinafter with reference to the accompanying drawings, in which preferred embodiments of the invention are shown. This invention may, however, be embodied in different forms and should not be construed as limited to the embodiments set forth herein. Rather, these embodiments are provided so that this disclosure will be thorough and complete, and will fully convey the scope of the invention to those skilled in the art. Like numbers refer to like elements throughout.

Figure 6:
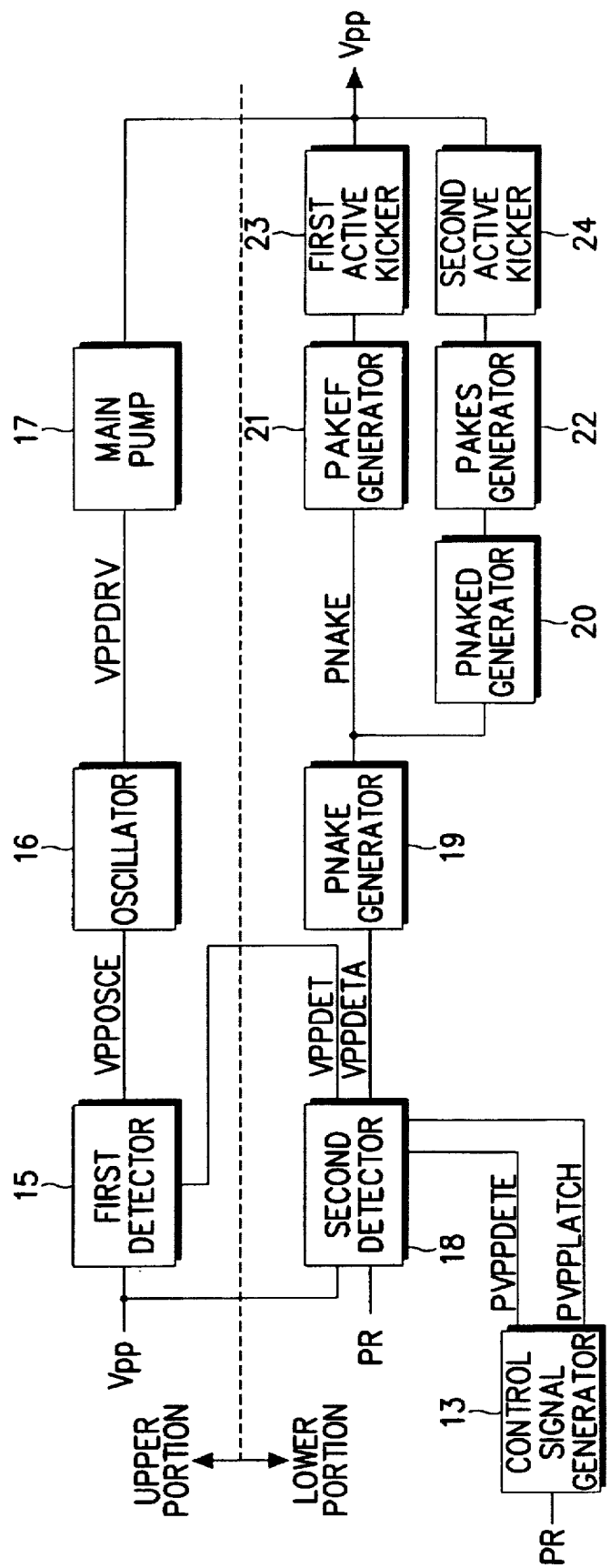
FIG. 6 is a block diagram illustrating the construction of a voltage boosting circuit according to an embodiment of the present invention.

Referring now to FIG. 6, an embodiment of an integrated circuit having backup voltage boosting capability according to the present invention will now be described. In particular, FIG. 6 illustrates a voltage boosting circuit comprised of a main voltage boosting circuit (upper portion) and a backup voltage boosting circuit (lower portion). Both the main and backup voltage boosting circuits have outputs which are collectively connected to a signal line (e.g., Vpp) which is to be driven to a boosted potential which typically exceeds the power supply potential (e.g., Vcc). According to this embodiment, the main boosting circuit comprises: (i) a first/main voltage level detector 15 for generating a predetermined output (e.g., VPPOSCE=logic 1) when the potential of the signal line to be boosted is below a predetermined reference potential; (ii) an oscillator 16 for generating an internal driver signal (e.g., VPPDRV) having a predetermined frequency which may be set by a ring of five (5) inverters 36, as illustrated best by FIG. 9; and (iii) a main pump 17 which may be configured to provide a voltage boost to the signal line Vpp in response to a rising edge of the internal driver signal VPPDRV.

In addition, the backup voltage boosting circuit comprises (i) a control signal generator 13 which is responsive to a clock signal (e.g., PR); (ii) a second independent voltage level detector 18 which may be set to trigger at a voltage level greater than (or equal to) the predetermined reference potential at which the main detector 15 is set; (iii) a latch 19, responsive to a clock signal (e.g., PR), for periodically generating a latch signal (e.g., PNAKE); (iv) a first pulse generator 21 for generating a first pulse (e.g., PAKEF) in response to the latch signal PNAKE and the clock signal PR; and (v) a first backup pump/active kicker 23 which may be configured to provide a voltage boost to the signal line Vpp in response to a rising edge of the first pulse PAKEF. Preferably, the backup voltage boosting circuit also comprises a delay circuit 20 for generating a time-delayed version of the latch signal (e.g., PNAKED), a second pulse generator 22 for generating a second pulse (e.g., PAKES) in response to the clock signal PR and the delayed version of the latch signal PNAKED, and a second backup pump/active kicker 24 which may be configured to provide a voltage boost in response to a rising edge of the second pulse PAKES.

Figure 7:
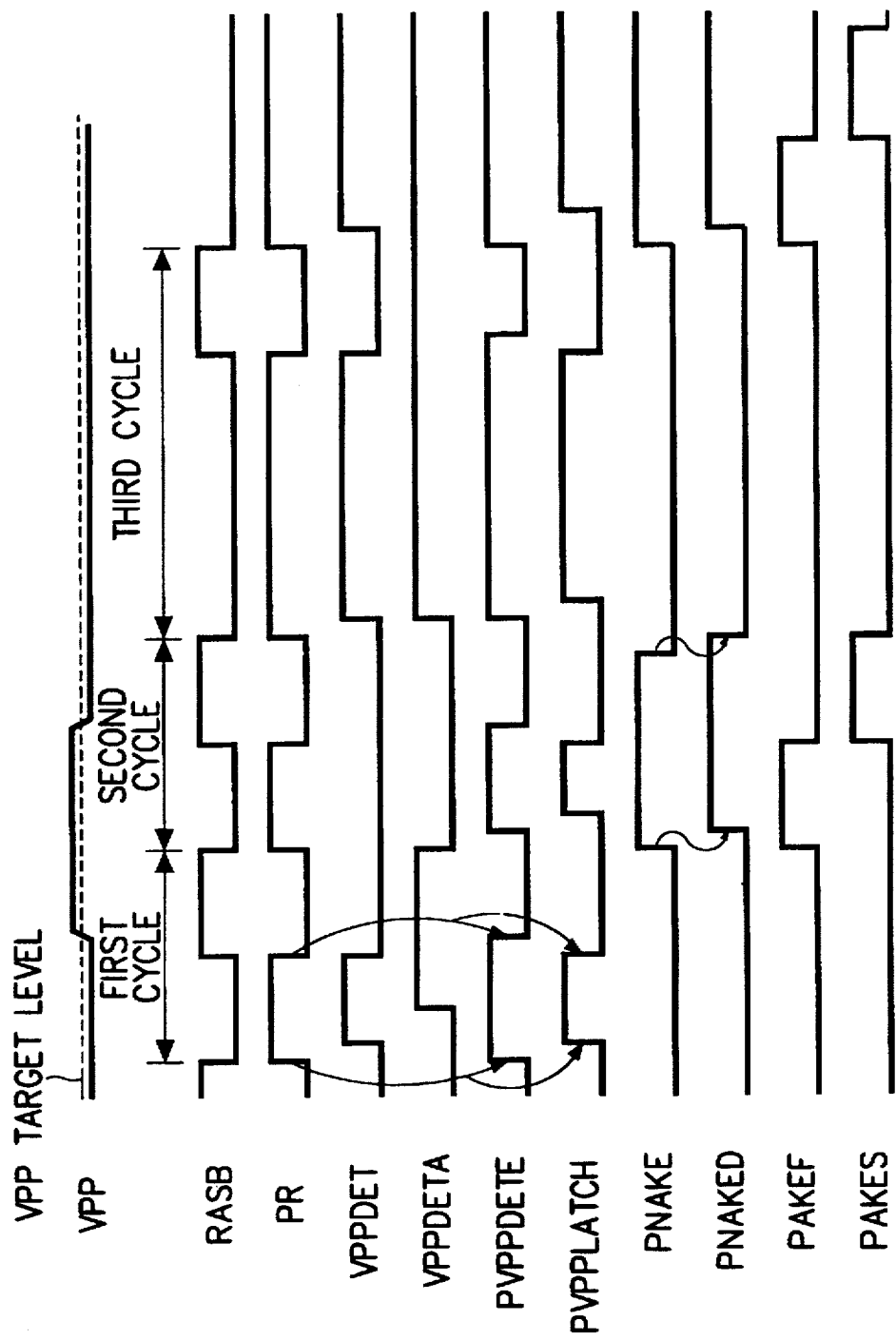
FIG. 7 is a diagram illustrating the timing of control signals generated internal to the circuit of FIG. 6.
Figure 8:
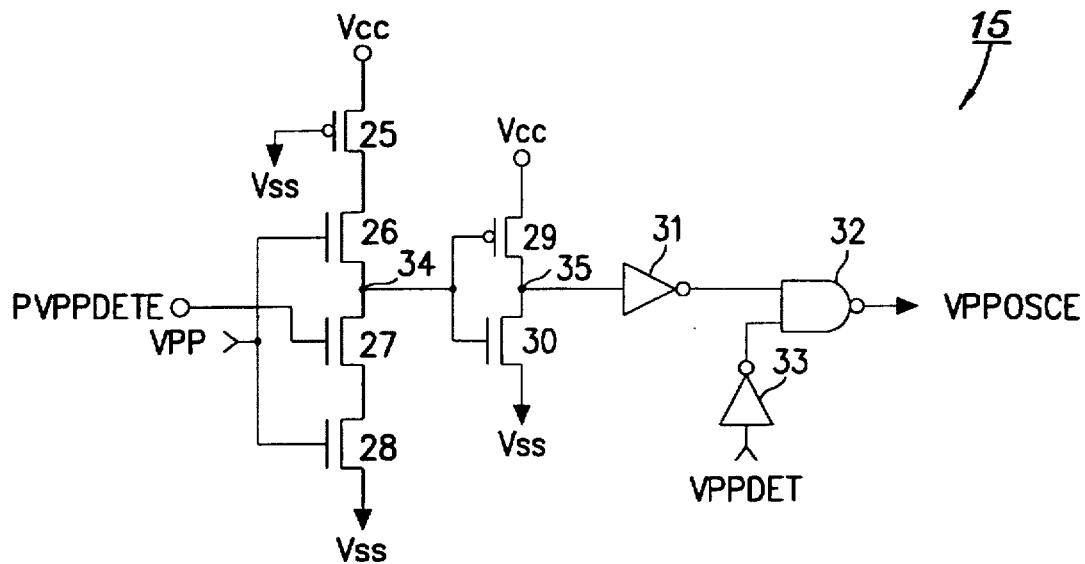
FIG. 8 is an electrical schematic of a main voltage level detector according to present invention.
Figure 9:
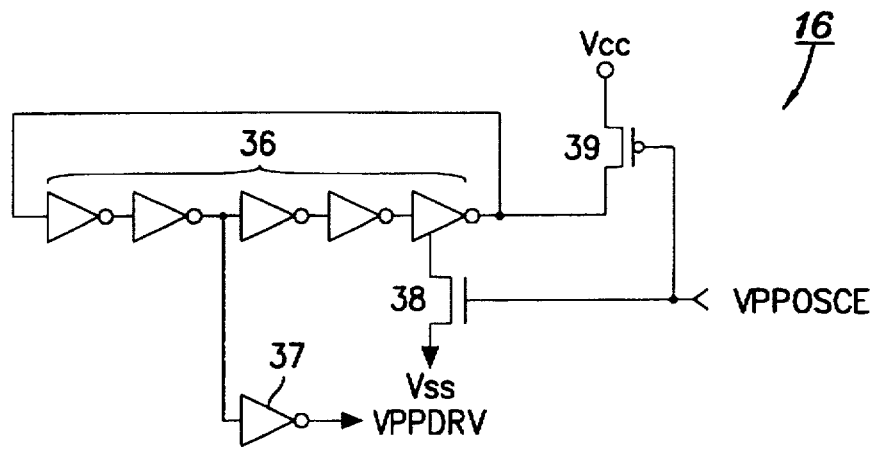
FIG. 9 is an electrical schematic of an oscillator according to the present invention.
Figure 10:
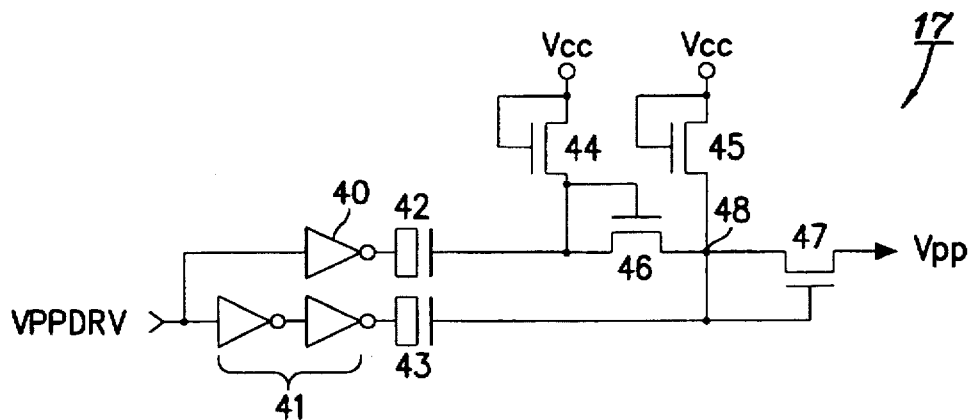
FIG. 10 is an electrical schematic of a main voltage boosting pump according to the present invention.
Figure 11:
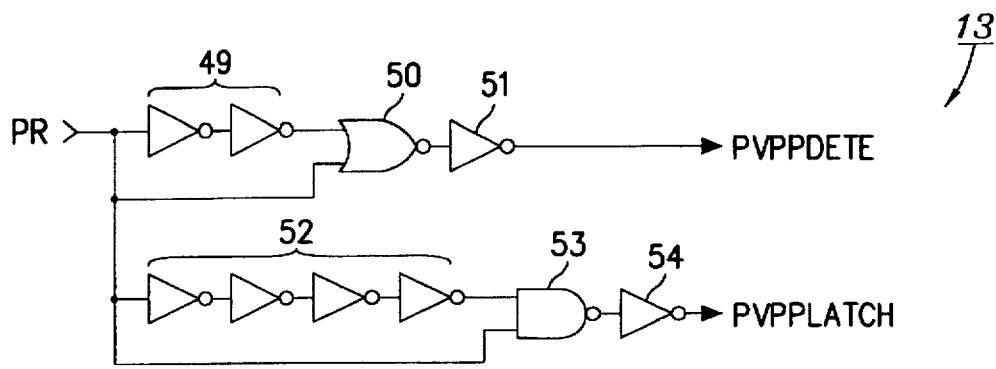
FIG. 11 is an electrical schematic of a control signal generator according to the present invention.
Figure 12:
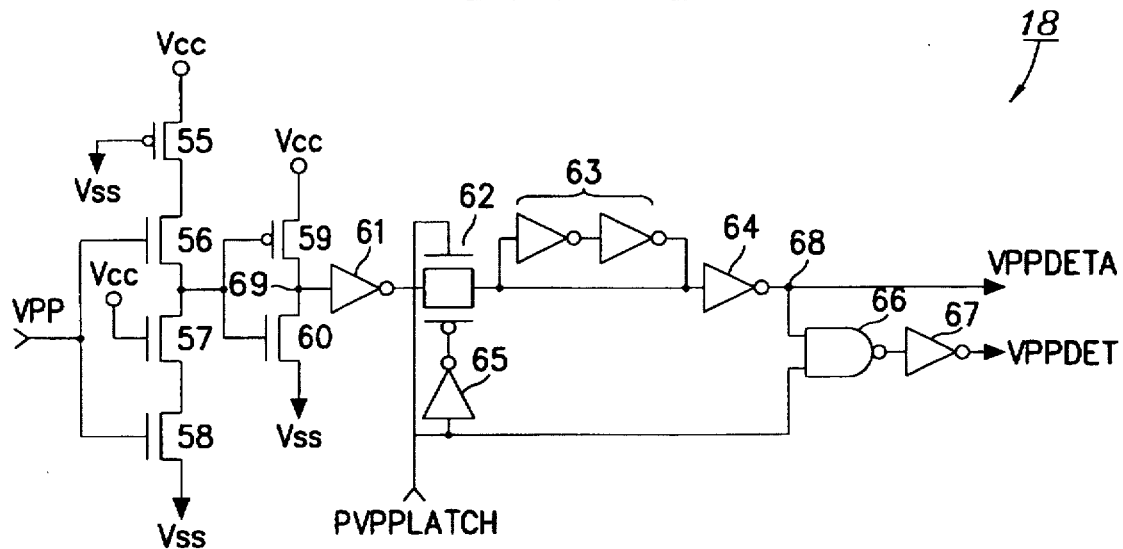
FIG. 12 is an electrical schematic of an independent voltage level detector according to the present invention.
Figure 13:
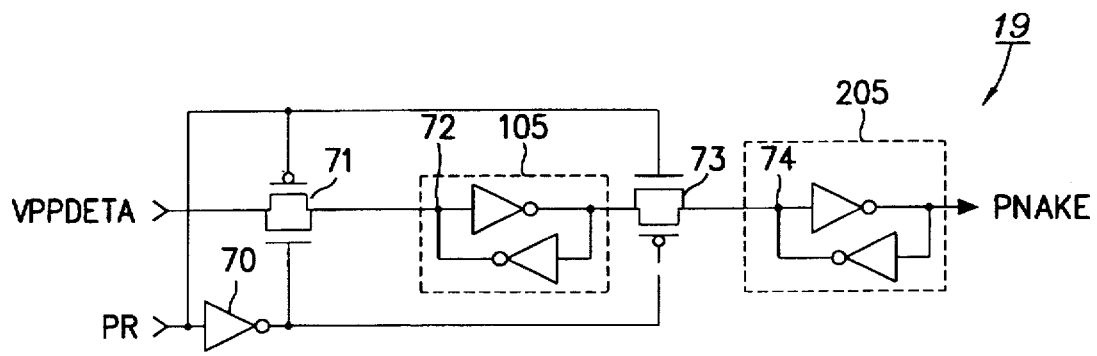
FIG. 13 is an electrical schematic of a latch circuit according to the present invention.
Figure 14:
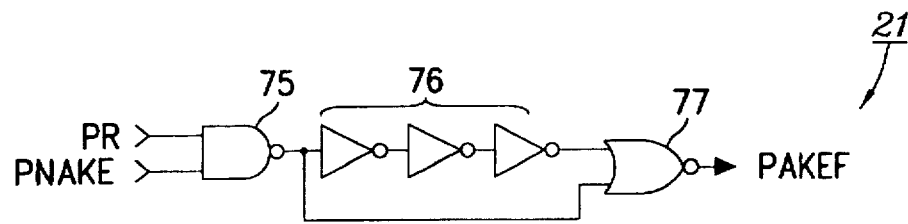
FIG. 14 is an electrical schematic of a first pulse generator according to the present invention.
Figure 15:
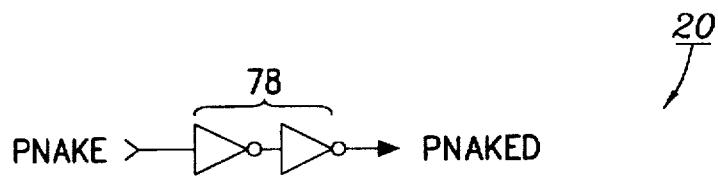
FIG. 15 is an electrical schematic of a delay circuit according to the present invention.
Figure 16:
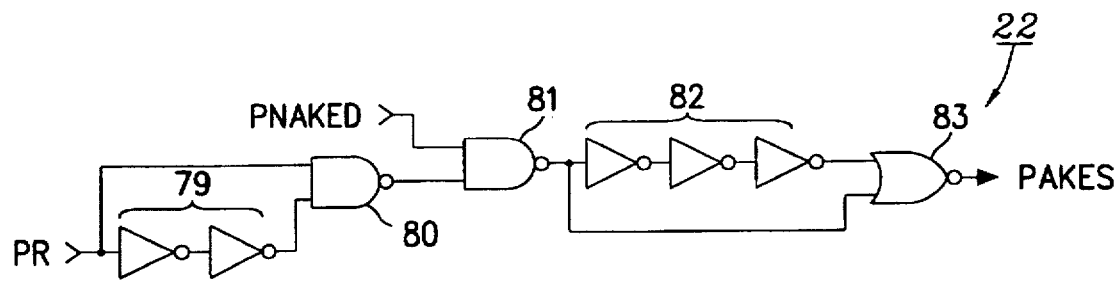
FIG. 16 is an electrical schematic of a second pulse generator according to the present invention.
Figure 17:
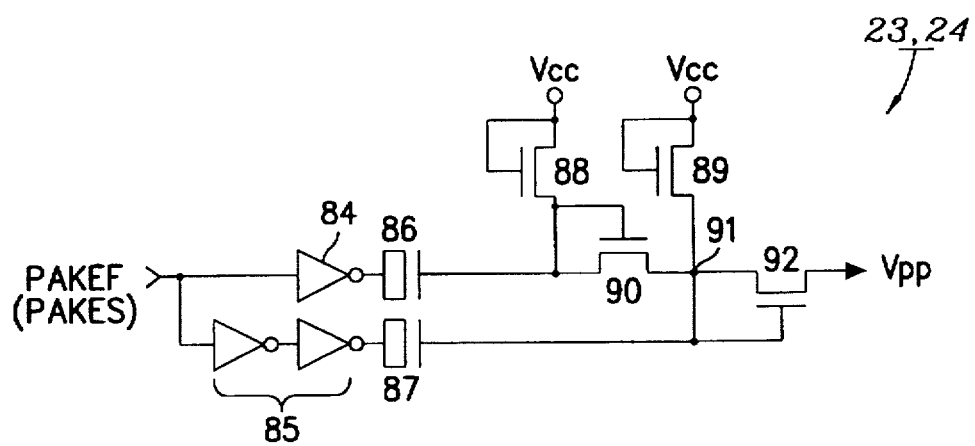
FIG. 17 is an electrical schematic of first and second backup voltage boosting pumps according to the present invention.

The construction and operation of the main and backup voltage boosting circuits and the subcircuits therein are more fully illustrated by FIGS. 7–17. In particular, FIG. 7 is a timing diagram illustrating the sequence of signals which cause the generation of the first and second pulses PAKEF and PAKES during nonoverlapping time intervals which are closely spaced so that the first and second backup pumps 23 and 24 trigger in close sequence (on the rising edges of the pulses). Here, the delay circuit 20 is preferably designed so that a sufficient time delay between the rising edges of the first and second pulses PAKEF and PAKES can be established. As determined by the inventors herein, the use of two backup pumps provides an effectively longer duration "boost" and therefore a more uniform supply of boosting current to the signal line Vpp during high current loading conditions. In addition, FIGS. 8–10 illustrate preferred embodiments of the main voltage level detector 15, the built-in oscillator 16 and the main pump 17, respectively. In FIGS. 11 and 12, preferred embodiments of the control signal generator 13 and independent voltage level detector 18 are illustrated and in FIGS. 13, 14 and 17, preferred embodiments of the latch 19, the first pulse generator 21 and first backup pump 23 are illustrated, respectively. Finally, FIGS. 15–17 illustrate preferred embodiments of the delay circuit 20, second pulse generator 22 and second backup pump 24, respectively.

Figure 1:
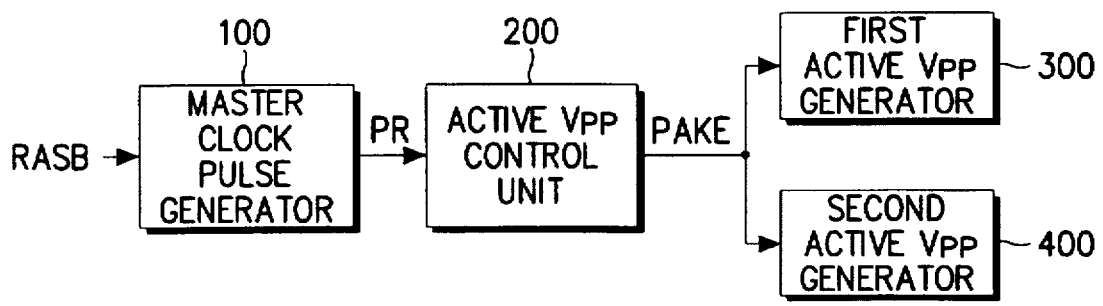
FIG. 1 is a block diagram illustrating a voltage boosting circuit according to the prior art.
Figure 2:
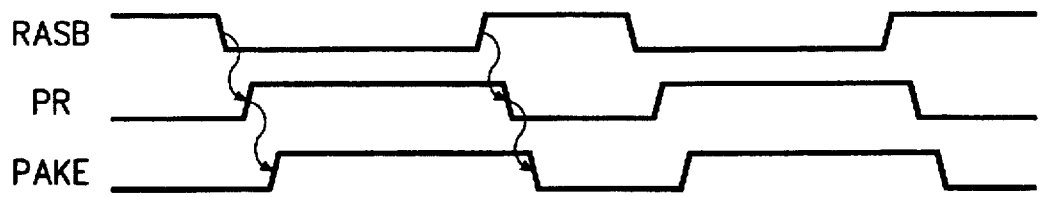
FIG. 2 illustrates the timing of control signals used to operate the voltage boosting circuit of FIG. 1.
Figure 3:
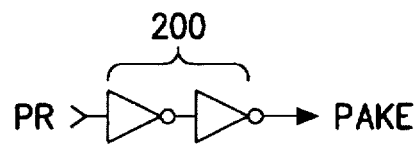
FIG. 3 illustrates an electrical schematic of an active boosted voltage control unit of FIG. 1.
Figure 4:
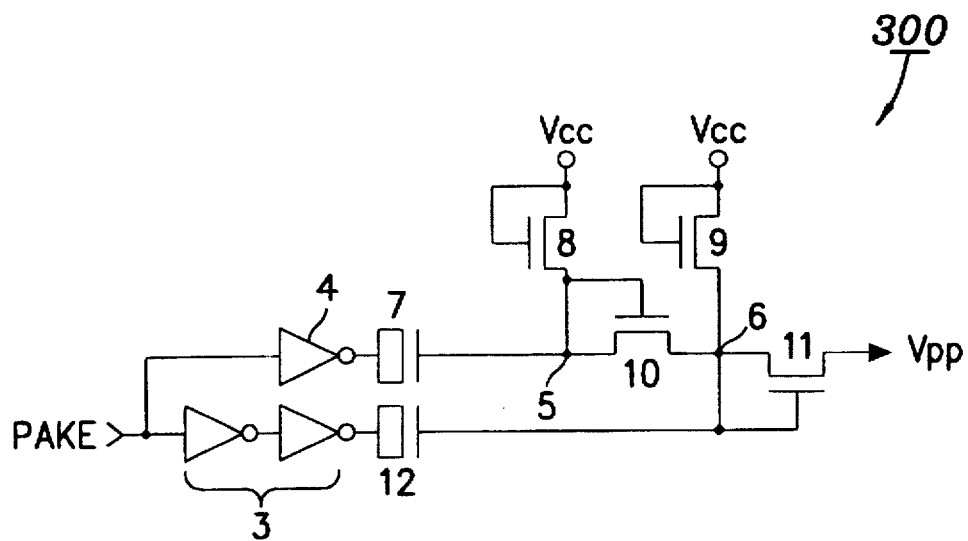
FIG. 4 illustrates an electrical schematic of a voltage boosting pump which is responsive to a rising edge of an input signal PAKE, according to the prior art.
Figure 5:
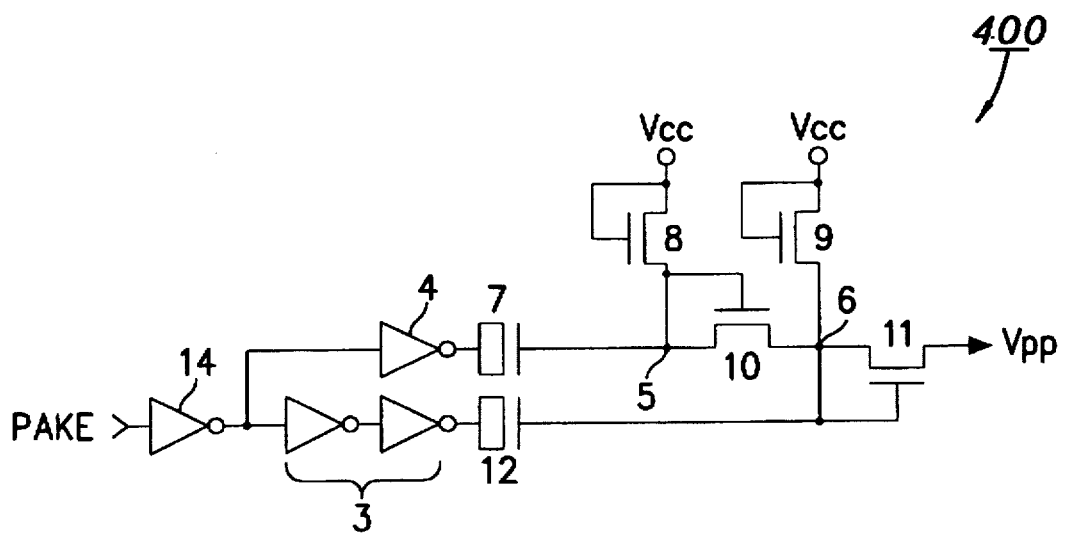
FIG. 5 illustrates an electrical schematic of a voltage boosting pump which is responsive to a falling edge of an input signal PAKE, according to the prior art.

Referring now to FIGS. 8–17 individually, the functional and electrical operation of the subcircuits will now be more fully described. According to the main voltage level detector 15 of FIG. 8, a control signal VPPOSCE for driving the oscillator 16 is generated as a logic 1 signal by inputting a logic 0 signal into either the first or second input of a two-input NAND gate 32. As illustrated, the top input to the NAND gate 32 is responsive to the generation of a logic 1 signal at node 35 which become inverted by an output inverter 31. As will be understood by those skilled in the art, the generation of a logic 1 signal at node 35 can be achieved by accurately designing the on-resistance (L/W) of the NMOS and PMOS transistors 25–30 so that they generate a logic 0 signal at node 34 if the input (e.g., Vpp) drops below a preselected threshold illustrated by the dotted line in FIG. 7. The control signal VPPOSCE is then provided as a single input to the oscillator 16 of FIG. 9. Upon receipt of a logic 1 signal, the PMOS pull-up transistor 39 in FIG. 9 turns off and an NMOS transistor 38 turns-on to allow the ring oscillator 36 (comprising five (5) serially connected inverters) to turn-on. An output of one of the middle inverters in the ring 36 is then fed to a driving inverter 37 to generate an internal boost voltage driver signal (i.e., built-in clock) VPPDRV which is fed to the main pump 17. Referring now to FIG. 10, the rising edges of the driver signal VPPDRV are then used to time the generation of periodic voltage boosts at an internal node 48 and the signal line Vpp (using charges provided by the power supply Vcc and stored by the first and second capacitors 42 and 43). The operation of the main pump 17, which comprises inverters 40 and 41, capacitors 42–43 and NMOS transistors 44–47, is similar to the operation of the prior art pump illustrated by FIG. 4 and need not be further described herein.

Referring now to FIGS. 11–12, the operation of a preferred control signal generator 13 and independent voltage level detector 18 will now be more fully described. Here, the generator 13 receives a clock signal PR and generates PVPPDETE and PVPPLATCH as control signals. In particular, PVPPDETE has the same general shape as clock signal PR but PVPPDETE has a falling edge which trails the falling edge in PR at each 1→0 transition by a delay amount equal to the delay associated with inverter chain 49, NOR gate 50 and output inverter 51. In contrast, PVPPLATCH has the same general shape as clock signal PR but PVPPLATCH has a rising edge which trails the rising edge of PR at each 0→1 transition by a delay amount equal to the delay associated with inverter chain 52, NAND gate 53 and output inverter 54. Thus, relative to PR, PVPPDETE has a longer logic 1 signal width and PVPPLATCH has a shorter logic 1 signal width.

As illustrated best by FIG. 12, the independent level detector 18 also uses a plurality of NMOS and PMOS transistors 55–60 to generate a logic 0 signal at node 69 and at the output of inverter 61 if the signal line Vpp drops below another preselected threshold voltage which may be greater than or equal to boost voltage target level illustrated by the dotted line in FIG. 7. The output of inverter 61 is then latched and held at each rising edge of PVPPLATCH (which is slightly delayed relative to the rising edge of the clock signal PR). Accordingly, if the signal line Vpp is below the preselected threshold voltage which the independent level detector 18 is set to trigger at, the output VPPDETA will switch high (i.e., 0→1) and remain high until Vpp is boosted above the preselected threshold voltage and PVPPLATCH is in a logic 1 state. The output VPPDET, however, will switch high but only remain high until PVPPLATCH switches back from 1→0. Thus, as illustrated best by FIG. 7, the logic 1 pulse widths of VPPDET are typically shorter than VPPDETA. These preferred characteristics are achieved using a pass transistor 62, inverters 63–65 and 67 and NAND gate 66 which generates a logic 1 output whenever VPPDETA goes low to a logic 0 state or PVPPLATCH goes low to a logic 0 state. Referring now again to FIG. 8, the first output of the independent level detector 18 is fed through inverter 33 to NAND gate 32. Thus, VPPOSCE will independently switch high whenever VPPDET switches high. Accordingly, even if the main level detector 15 has not yet triggered the oscillator during high current loading conditions (e.g., when a DRAM memory device is in an active mode), the independent level detector 18 can kick in to activate the oscillator 16 to drive the main pump 17. This typically occurs whenever the independent level detector 18 is set to trigger at a higher potential than the main detector 15 and the clock signal PR is active.

Referring now to FIG. 13, the output PNAKE of the latch 19 switches to a logic 1 state whenever VPPDETA is high at the rising edge of the clock signal PR and switches to a logic 0 state whenever VPPDETA is low at the rising edge of the clock signal PR. As illustrated, the latch 19 comprises an input stage 105 and an output stage 205. The value of VPPDETA is loaded into the input stage 105 during the time period when PR is low and the output of inverter 70 is high so that pass gate 71 is open and pass gate 73 is closed. Thus, node 72 will equal the value of VPPDETA when PR is low and then when PR transitions from 0→1 the value of node 72 will be passed through the output stage 205 as the value of PNAKE (because the value of node 74 will be the binary opposite of the value of node 72).

Referring now to FIG. 14, the first pulse generator 21 then generates a logic 1 pulse as PAKEF whenever PNAKE and PR overlap at a logic 1 potential and the output of NAND gate 75 switches from 1→0. As will be understood by those skilled in the art, the width of the logic 1 pulse PAKEF is determined by the delay associated with the chain of inverters 76 and NOR gate 77. Referring now to FIG. 15, the delay circuit 20 comprise two inverters as delay chain 78 to generate PNAKED from PNAKE. Accordingly, whenever PNAKED becomes high while the clock signal PR is low, the output PAKES of the second pulse generator 22 will generate a logic 1 pulse having a width determined by the delay associated with the chain of inverters 82 and NOR gate 83 illustrated in FIG. 16. Here, the second pulse generator 22 also includes a chain of inverters 79 which receive PR, and NAND gates 80 and 81.

Thus, as illustrated best by FIG. 7, the first and second pulses PAKEF and PAKES are generated during nonoverlapping time intervals because of the delay associated with the delay generator 20 and the fact that the second pulse generator 22 is responsive to the clock signal PR when it is in the logic 0 state while the first pulse generator is responsive to the clock signal PR when it is in the logic 1 state. Referring now to FIG. 17, these first and second pulse signals PAKEF and PAKES are then applied to drive respective first and second backup pumps 23 and 24 which boost the signal line Vpp upon the 0→1 transition of PAKEF and PAKES. Here the first and second backup pumps include inverters 84–85, capacitors 86–87 and NMOS transistors 88–90 and 92 coupled at node 91.

Accordingly, as described above, the present invention provides a voltage boosting circuit having backup voltage boosting circuits that kick in to anticipate high current loading conditions when voltage sags in the potential of a boosted signal line(s) occur. The backup circuits also provide independent level detection capability to bypass a main voltage level detector whenever the independent level detector is set to trigger at a higher threshold voltage when the clock signal PR is active.

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed is:

1. An integrated circuit having backup voltage boosting capability, comprising:

a main voltage boosting circuit powered at a first reference potential and containing a main level detector, a ring oscillator and a main pump coupled in series to drive a signal line to a boosted reference potential which is greater than the first reference potential, when a potential of the signal line drops below a second reference potential; and a backup voltage boosting circuit containing an independent level detector and a first backup pump coupled in series to drive the signal line to the boosted reference potential when the potential of the signal line drops below a third reference potential.

2. An integrated circuit having backup voltage boosting capability, comprising:

a main voltage boosting circuit powered at a first reference potential and containing a main level detector, an oscillator and a main pump coupled in series to drive a signal line to a boosted reference potential which is greater than the first reference potential, when a potential of the signal line drops below a second reference potential; and a backup voltage boosting circuit containing an independent level detector and a first backup pump coupled in series to drive the signal line to the boosted reference potential when the potential of the signal line drops below a third reference potential;

wherein the independent level detector has a first output coupled to the oscillator to thereby activate the main pump when the potential of the signal line drops below the third reference potential.

3. The integrated circuit of claim 2, wherein the oscillator is responsive to an output of a two-input NAND gate having a first input coupled to an output of the main level detector and a second input coupled to the first output of the independent level detector.

4. The integrated circuit of claim 2, wherein the independent level detector has a second output coupled to the first backup pump; wherein if the potential of the signal line drops below the third reference potential, the first output transitions from a first logic potential to a second logic potential in response to a transition in a clock signal; and wherein in response to a transition in the clock signal, the second output transitions from the first logic potential to the second logic potential and stays at the second logic potential at least until the potential of the signal line is above the third reference potential.

5. The integrated circuit of claim 2, further comprising:

a latch, coupled to a second output of the independent level detector; and a first pulse generator, responsive to an output of the latch and a clock signal, to drive the first backup pump.

6. The integrated circuit of claim 5, wherein said backup voltage boosting circuit further comprises a delay circuit, a second pulse generator and a second backup pump coupled in series and responsive to the output of the latch, to drive the signal line to the boosted reference potential if the potential of the signal line drops below the third reference potential.

7. The integrated circuit of claim 6, wherein the first and second backup pumps drive the signal line to the boosted reference potential during respective nonoverlapping time intervals.

8. The integrated circuit of claim 7, wherein the main and first backup pumps drive the signal line to the boosted reference potential during overlapping time intervals.

9. An integrated circuit having backup voltage boosting capability, comprising:

a main voltage boosting circuit powered at a first reference potential and containing a main level detector and a main pump coupled in series therein to drive a signal line to a boosted reference potential which is greater than the first reference potential, when a potential of the signal line drops below a second reference potential; and a backup voltage boosting circuit containing an independent level detector and a first backup pump coupled in series therein to drive the signal line to the boosted reference potential when the potential of the signal line drops below a third reference potential which is greater than the second reference potential, and a second backup pump coupled in series with the independent level detector; and wherein the first and second backup pumps drive the signal line to the boosted reference potential during respective nonoverlapping time intervals.

10. The integrated circuit of claim 9, wherein the main and first backup pumps drive the signal line to the boosted reference potential during overlapping time intervals.

* * * * *